US007609002B2

(12) United States Patent
Lee

(10) Patent No.: US 7,609,002 B2
(45) Date of Patent: Oct. 27, 2009

(54) PLASMA ACCELERATING APPARATUS AND PLASMA PROCESSING SYSTEM HAVING THE SAME

(75) Inventor: Won-tae Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 525 days.

(21) Appl. No.: 11/410,933

(22) Filed: Apr. 26, 2006

(65) Prior Publication Data

US 2007/0024201 A1    Feb. 1, 2007

(30) Foreign Application Priority Data

Jul. 29, 2005   (KR) .................. 10-2005-0069279

(51) Int. Cl.
*H01J 7/24*   (2006.01)
(52) U.S. Cl. ..................... 315/111.21; 315/111.61; 315/111.81; 250/251
(58) Field of Classification Search ............ 315/111.21, 315/111.61, 111.71, 111.81; 250/251
See application file for complete search history.

(56) References Cited

U.S. PATENT DOCUMENTS 7,034,285 B2 *   4/2006   Ichiki et al. .................. 250/251

FOREIGN PATENT DOCUMENTS

| JP | 59-151428 A | 8/1984 |
| JP | 62-185324 A | 8/1987 |
| JP | 9-139364 A | 5/1997 |
| JP | 2001-156013 A | 6/2001 |
| JP | 2003-533022 A | 11/2003 |
| JP | 2004-281232 A | 10/2004 |
| JP | 2004-327405 A | 11/2004 |
| KR | 2003-0042958 A | 6/2003 |

* cited by examiner

*Primary Examiner*—David Hung Vu
(74) *Attorney, Agent, or Firm*—Sughrue Mion, PLLC

(57) ABSTRACT

A plasma accelerating apparatus and a plasma processing system, which efficiently elevate a drift velocity of a plasma beam and are simple to manufacture and simple in construction. A channel includes an outlet port opening at an end of the channel. A gas supply portion supplies a gas in the channel. A plasma generator provides ionization energy to the gas in the channel to generate a plasma beam. A plasma accelerating portion includes a plurality of grids transversely arranged spaced apart from each other by a predetermined distance in the channel for accelerating the plasma beam generated by the plasma generator to the outlet port of the channel with an electric field. The plasma accelerating apparatus and the plasma processing system elevate a drift velocity of the plasma beam more efficiently than conventional accelerating apparatuses that use an electromagnetic force induced by a magnetic field and a secondary current.

8 Claims, 8 Drawing Sheets

PLASMA ACCELERATING APPARATUS AND PLASMA PROCESSING SYSTEM HAVING THE SAME

CROSS-REFERENCE TO RELATED APPLICATIONS

This application claims the benefit of priority under 35 U.S.C. § 119(a) from Korean Patent Application No. 10-2005-0069279, filed on Jul. 29, 2005 in the Korean Intellectual Property Office, the entire contents of which are incorporated herein by reference.

BACKGROUND OF THE INVENTION

1. Field of the Invention

Apparatuses consistent with the present invention relate to a plasma accelerating, and more particularly, to a plasma accelerating apparatus and a plasma processing system having the same, which are used for semiconductor substrate processing for etching and removing a thin film from a substrate or depositing the thin film on the substrate.

2. Description of the Related Art

In recent years, with the increased need for high speed microprocessors and high recording density memories, techniques for reducing a thickness of a gate dielectric substance and a lateral size of a logic element has been actively developed so that many elements can be mounted on one semiconductor chip. There are techniques for reducing a gate length of a transistor to less than 35 mm, a thickness of a gate oxide to less than 0.5 nm, or improving a metallization level greater than 6 as examples of the aforementioned techniques.

However, in order to embody such techniques, high performance deposition and/or etching devices capable of increasing a mounting density of a device at the time of a manufacturing process of the semiconductor chip, have been required. Among the high performance deposition and/or etching devices, a plasma etcher or a plasma sputtering system using a plasma accelerating apparatus has been widely used.

FIG. 1 is a schematic cut-away perspective view showing a Hall effect plasma accelerating apparatus 10 used for a plasma etcher or a plasma sputtering system as an example of a conventional plasma accelerating apparatus. The Hall effect plasma accelerating apparatus 10 is disclosed in U.S. Pat. No. 5,847,593.

With reference to FIG. 1, the Hall effect plasma accelerating apparatus 10 includes a circular channel 22 having an upper shielded end and a lower open end. An internal circle coil 16, and external circle coils 17, 18, 18', and 19 are coaxially positioned at an inside and an outside of the circular channel 22 in a line. The circle coils 16, 17, 18, 18', and 19 have physically and magnetically isolated polarity so as to form a magnetic field. A circular anode electrode 24 is connected to a gas supply pipe 25 and ionizes a supplied gas. A cathode electrode 27 is positioned on a magnetic pole of a lower end of channel 22, is connected to the gas supply line 29, and supplies electrons. The external circle coils 17, 18, 18', and 19 are divided into an upper coil 17 and lower coils 18, 18' and 19 of separated sections. Encircling an outside of the channel 22 is the upper coil 17 and encircling an opening of the channel 22 are the lower coils 18, 18' and 19. Upper portions of the upper coil 17 and the internal coil 16 are isolated by a dielectric layer 23. A magnetic field of the isolated region is shielded, so that a partially magnetic field intersecting a space portion 20 of the channel 22 is induced at only a region of an opening 22a of the channel 22, but not at an entire portion of the channel 22. A magnetic field formed at positions of the lower coils 18, 18' and 19 partially captures electrons.

Consequently, the Hall effect plasma accelerating apparatus 10 may accelerate only positive ions but not an electrically neutral plasma by a magnetic field formed due to presences of the anode electrode 24 and the cathode electrode 27. Furthermore, the Hall effect plasma accelerating apparatus 10 laminates a charge on a surface of a substrate on which ions are deposited, causing a loss like a charge shunt and notching occurs in a minute pattern that may lead to a formation of a non-uniform etching profile.

FIG. 2 is a cross-sectional view showing a coaxial plasma accelerating apparatus 40 used for a plasma sputtering system or a plasma etcher as another example of a conventional plasma accelerating apparatus. The coaxial plasma accelerating apparatus 40 is disclosed in the article by J. T. Scheuer, et. al., IEEE Tran. on Plasma Sci., VOL. 22, No. 6, 1015, 1994.

Referring to FIG. 2, the coaxial plasma accelerating apparatus 40 includes a circular channel having an upper shield end and a lower open end. The circular channel 50 accelerates plasma produced by the discharging of an internally introduced gas. A cylindrical cathode electrode 54 is positioned inside the channel 50. A cylindrical anode electrode 52 is positioned at an outer side of an opening of the channel 50, which is coaxially spaced apart from the cylindrical cathode electrode 54 by a predetermined distance. In addition, the coaxial plasma accelerating apparatus 40 includes a control coil 64, a cathode coil 56, and an anode coil 58. The control coil 64 controls plasma in the channel 50. The cathode coil 56 is provided inside the cathode electrode 54. The anode coil 58 is provided outside the anode electrode 52.

The coaxial plasma accelerating apparatus 40 shown in FIG. 2 generates an electric current flowing through the channel 50 and induces a radial magnetic field enclosing the cathode electrode 54 by the current generated by including a channel 50 and a control coil 64. Here, the channel 50 has inner and outer walls in which the anode electrode 52 and the cathode electrode 54 are provided, respectively, and the control coil 64 is provided at an outside of the channel 50. In the coaxial plasma accelerating apparatus 40, a speed of plasma ions at an outlet port is very high, for example, about 500 eV. Further, a direct current discharge by an anode electrode and a cathode electrode is used, and thus plasma ions accelerated from the anode electrode 52 to the cathode electrode 54 collide with the cathode electrode 54 in the channel 50. However, the cathode electrode 54 is significantly damaged by such collisions and becomes difficult to use for an etching process of a semiconductor thin film deposition process.

In order to address the aforementioned problems, and other problems, an inductively coupled discharge type plasma accelerating apparatus 60 has been suggested as shown in FIG. 3 and FIG. 4. With reference to FIG. 3, the inductively coupled discharge type plasma accelerating apparatus 60 includes a plasma channel 77, an upper circle loop inductor 79, an internal circle loop inductor 71, and an external circle loop inductor 73.

A gas is ionized and accelerated in the plasma channel 77. The plasma channel 77 has a doughnut shape, which includes a downward open outlet port 77a. The outlet port 77a communicates with a process chamber (not shown) of a plasma etcher or a sputtering system of the plasma accelerating apparatus 60. An upper circle loop inductor 79 is disposed at an end wall 81 of the plasma channel 77. The upper circle loop inductor 79 applies radio frequency ("RF") energy to the gas in the plasma channel 77 to generate electrons. The generated electrons collide with neutral atoms of the gas to form a plasma beam. Internal circle loop inductor 71 and external circle loop inductor 73, in which coils are wound, are disposed at an inner wall 82 and an outer wall 83 of the plasma channel 77, respectively. The internal circle loop inductor 71 and the external circle loop inductor 73 are coaxially arranged.

Hereinafter an operation of the plasma accelerating apparatus 60 will be described. When a gas is supplied to an inside of the plasma channel 77 from a gas source (not shown), the upper circle loop inductor 79 applies RF energy to the supplied gas to generate electrons. Consequently, the electrons collide with neutral atoms of the gas, and the gas is ionized to produce a plasma beam.

Referring to FIG. 4, the internal circle loop inductor 71 and the external circle loop inductor 73 induce a magnetic field B and a secondary electric current J in the plasma channel 77 to form an electromagnetic force F, which accelerates the plasma beam toward an outlet port 77a of the plasma channel 77. Moreover, the internal circle loop inductor 71 and the external circle loop inductor 73 are configured to reduce the number of turns of a coil wound therein, or to reduce an electric current flowing through a coil having the same number of turns along an axial direction. Accordingly, the magnetic field B, which is induced in the plasma channel 77, is reduced in an axial direction, and a drift velocity of the plasma beam toward an outlet port 77a of the plasma channel 77 is increased.

Since such a plasma accelerating apparatus 60 accelerates ions in the same direction regardless of a polarity of the electromagnetic force F, an anode electrode and a cathode electrode that the conventional electrostatic type accelerating apparatuses 10 and 40 must always include becomes unnecessary and, thus, leads to a simple construction thereof. Furthermore, the plasma accelerating apparatus 60 adjusts an electric current through the internal circle loop inductor 71 and the external circle loop inductor 73 that allows the generated electromagnetic force F to be adjusted in a simple manner.

However, in the plasma etcher or the sputtering system using the plasma accelerating apparatus 60, the etching rate for an etching or sputtering generation depends on ion energy and plasma density. The ion energy and the plasma density are influenced by not only an RF energy which is applied to an inside of the plasma channel 77 to generate the plasma beam, but also by an electromagnetic force F which accelerates the generated plasma beam toward the outlet port 77a of the plasma channel 77. Since the electromagnetic force F is induced with a magnetic field B and a second electric current J formed inside the plasma channel 77 by the internal circle loop inductor 71 and the external circle loop inductor 73, what is needed for an increase of the electromagnetic force F is to elevate a voltage applied to the internal circle loop inductor 71 and to the external circle loop inductor 73. However, because the a voltage applied to the internal circle loop inductor 71 and the external circle loop inductor 73 can not be increased without limit while maintaining operation efficiency, there is a limitation to increasing a drift velocity of the plasma beam by increasing the electromagnetic force F in order to increase the ion energy and the plasma density.

Furthermore, in order to enhance the accelerating efficiency of the plasma beam in the conventional plasma accelerating apparatus 60, the number of turns of the coils wound within the internal circle loop inductor 71 and the external circle loop inductor 73 is reduced in an axial direction, or an electric current flowing through the coils is reduced in an axial direction using the same number of turns of the coil, thereby causing the magnetic field B induced inside the plasma channel 77 to be reduced in the axial direction. However, in this case, the internal circle loop inductor 71 and the external circle loop inductor 73 should be separated from each other in an axial direction. Further, different electric currents must be applied to the internal circle loop inductor 71 and the external circle loop inductor 73 or the numbers of turns of the coils must be configured to be different from each other. As a result, it is difficult to manufacture the internal circle loop inductor 71 and the external circle loop inductor 73, and constructions thereof become complex.

Therefore, an improved plasma accelerating apparatus is needed, which may efficiently elevate a drift velocity of a plasma beam, thereby influencing a performance of a plasma etcher or a sputtering system, and which is simple to manufacture and simple in construction.

SUMMARY OF THE INVENTION

Accordingly, it is an aspect of the present invention to provide a plasma accelerating apparatus and a plasma processing system having the same, which efficiently elevate a drift velocity of a plasma beam, and which is simple to manufacture and simple in construction.

The above aspect of the present invention, and others, are substantially realized by providing a plasma accelerating apparatus, comprising: a channel including an outlet port opening at an end; a gas supply portion for supplying a gas in the channel; a plasma generator for providing ionization energy to the gas in the channel to generate a plasma beam; and a plasma accelerating portion including a plurality of grids transversely arranged spaced apart from each other by a predetermined distance in the channel for accelerating the plasma beam generated by the plasma generator to the outlet port of the channel with an electric field.

Preferably, but not necessarily, the plurality of grids may include: a first grid including at least one first opening through which the plasma beam passes, positive pulse voltage being applied to the first grid so that the first grid accelerates electrons of the plasma beam; and a second grid including at least one second opening through which the plasma beam passes, and a negative pulse voltage being applied to the second grid so that the second grid accelerates ions of the plasma beam. The first and second openings of the first and second grids may be formed in patterns opposite to each other so that at least parts of the first and second openings do not communicate with each other in a moving direction of the plasma beam.

The positive pulse voltage and the negative pulse voltage may be not simultaneously applied so that one of pulses of the positive and negative pulse voltages pushes electrons or ions when the other thereof attracts the electrons or ions. Also, the positive pulse voltage may be a pulse voltage of a predetermined potential that has a waveform repeating on/off at predetermined time intervals, and the negative pulse voltage may be a pulse voltage of a predetermined potential that has a waveform repeating on/off at predetermined time intervals. Alternatively, the first and second grids may be spaced apart from each other by a distance of 10 cm to 70 cm.

In accordance with another aspect of the present invention, there is provided a plasma processing system, comprising: a channel including an outlet port opening at an end; a first gas supply portion for supplying a gas in the channel; a plasma generator for providing ionization energy to the gas in the channel to generate a plasma beam; a plasma accelerating portion including a plurality of grids transversely arranged spaced apart from each other by a predetermined distance in the channel for accelerating the plasma beam generated by the plasma generator to the outlet port of the channel with an electric field; and a process chamber communicating with the outlet port of the channel, and including a substrate holder for fixing a substrate.

Preferably, but not necessarily, the plurality of grids may include: a first grid including at least one first opening through which the plasma beam passes, a positive pulse voltage being applied to the first grid so that the first grid accelerates electrons of the plasma beam; and at least one second grid including a second opening through which the plasma beam passes, a negative pulse voltage being applied to the second grid so that the second grid accelerates ions of the plasma beam. The first and second openings of the first and second grids may be formed in patterns opposite to each other so that at least parts of the first and second openings do not communicate with each other in a moving direction of the plasma beam.

Most preferably, the positive pulse voltage and the negative pulse voltage may be not simultaneously applied so that one of pulses of the positive and negative pulse voltages pushes electrons or ions when the other thereof attracts the electrons or ions. In an exemplary embodiment, the positive pulse voltage may a pulse voltage of a predetermined potential that has a waveform repeating on/off at predetermined time intervals, and the negative pulse voltage may be a pulse voltage of a predetermined potential that has a waveform repeating on/off at predetermined time intervals. Also, the first and second grids may be spaced apart from each other by a distance of 10 to 70 cm. Alternatively, the system may further comprise a second gas supply portion for supplying a process gas into the process chamber.

BRIEF DESCRIPTION OF THE DRAWINGS

The above aspects and features of the present invention will become more apparent by describing certain exemplary embodiments of the present invention with reference to the accompanying drawings, in which.

DETAILED DESCRIPTION OF THE EXEMPLARY EMBODIMENTS OF THE PRESENT INVENTION

Hereinafter, a plasma accelerating apparatus and a plasma processing system according to exemplary embodiments of the present invention will be described in detail with reference to accompanying drawings.

Figure 1:
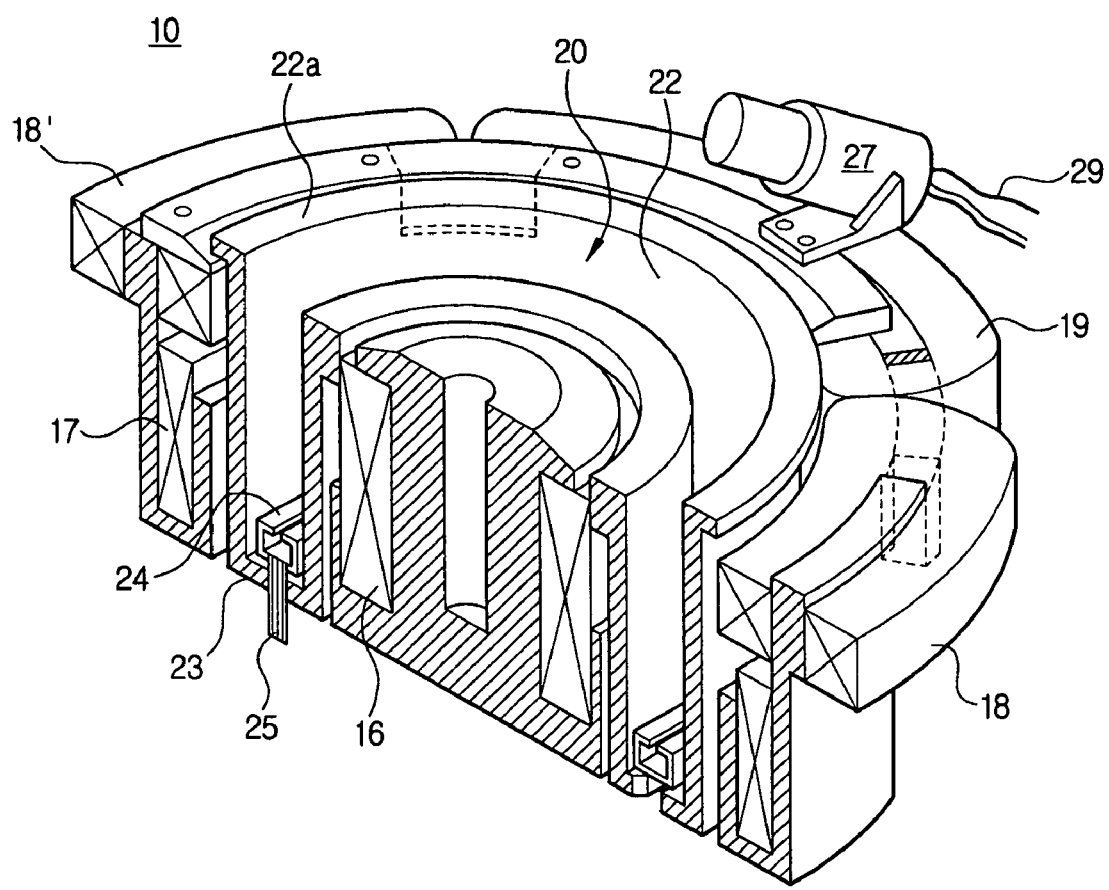
FIG. 1 is a schematic cut-away perspective view showing an example of a conventional plasma accelerating apparatus.
Figure 2:
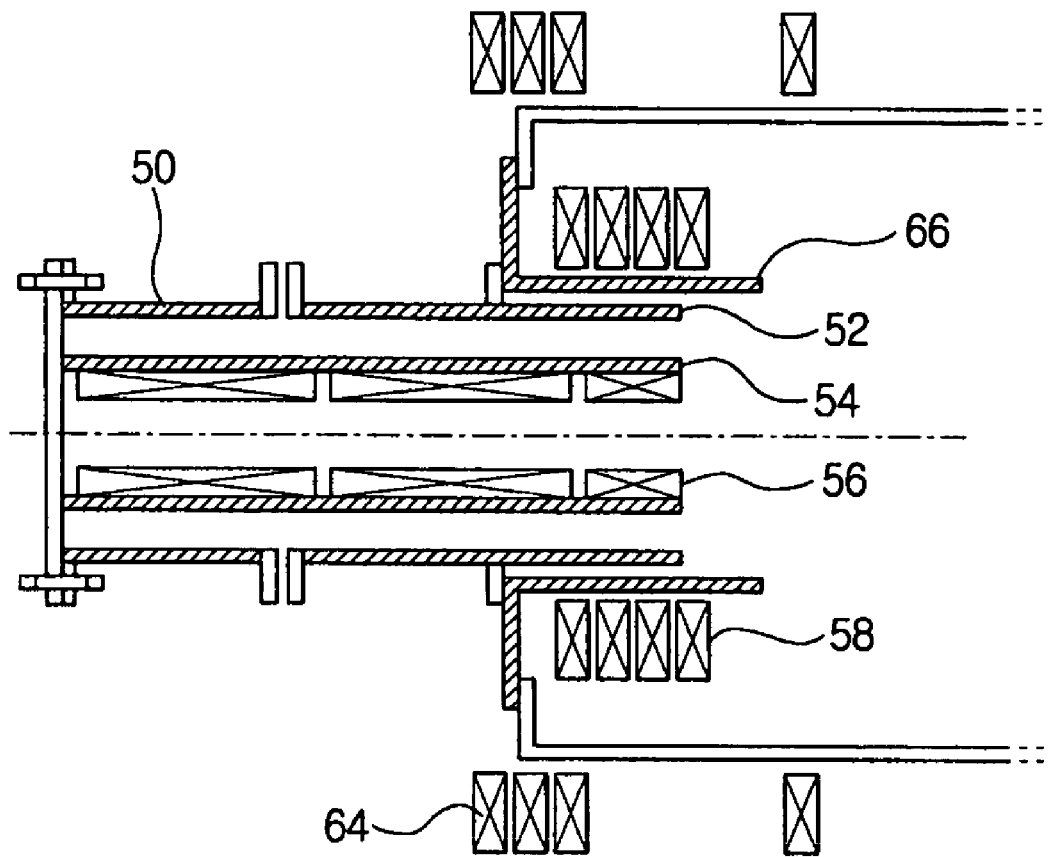
FIG. 2 is a cross-sectional view showing another example of a conventional plasma accelerating apparatus.
Figure 3:
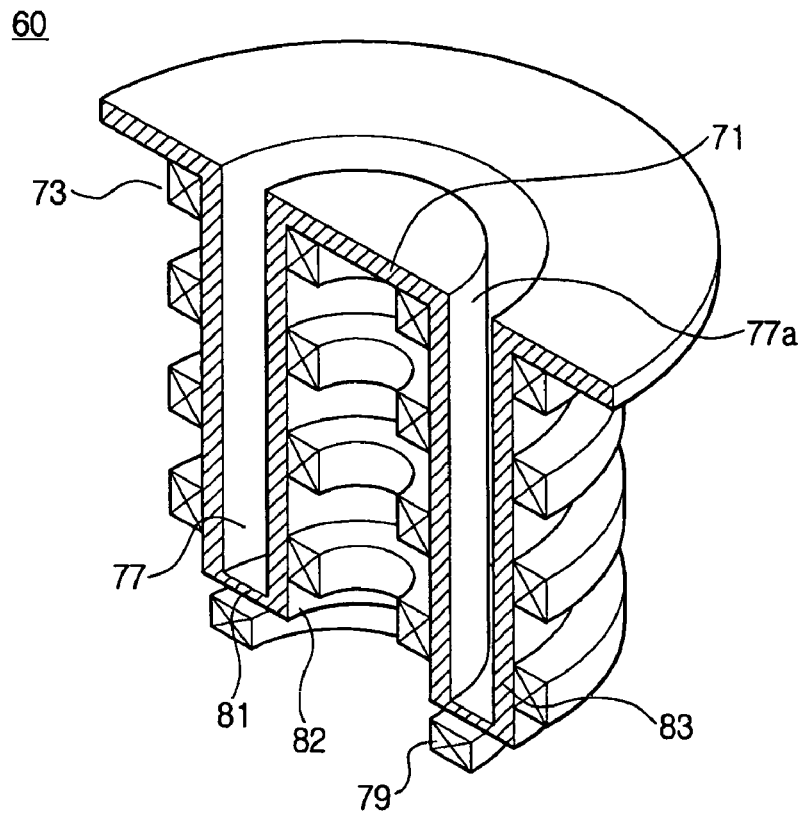
FIG. 3 is a schematic cut-away perspective view showing a further example of a conventional plasma accelerating apparatus.
Figure 4:
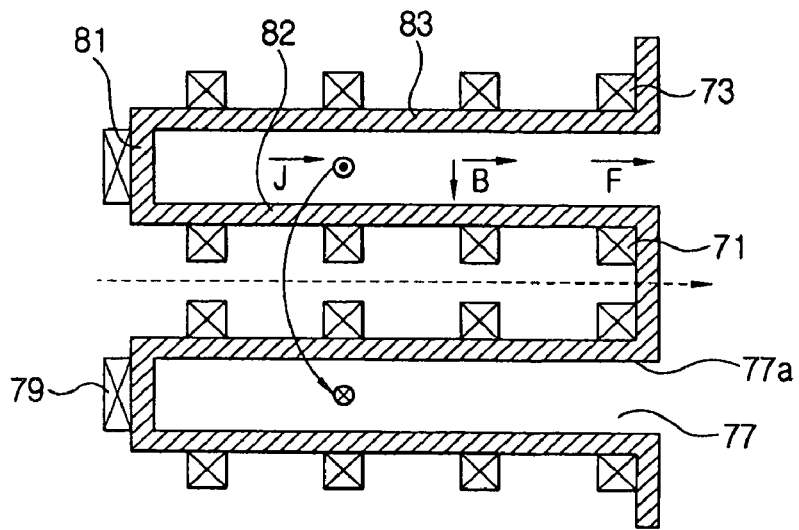
FIG. 4 is a cross-sectional view of the plasma accelerating apparatus shown in FIG. 3.
Figure 5:
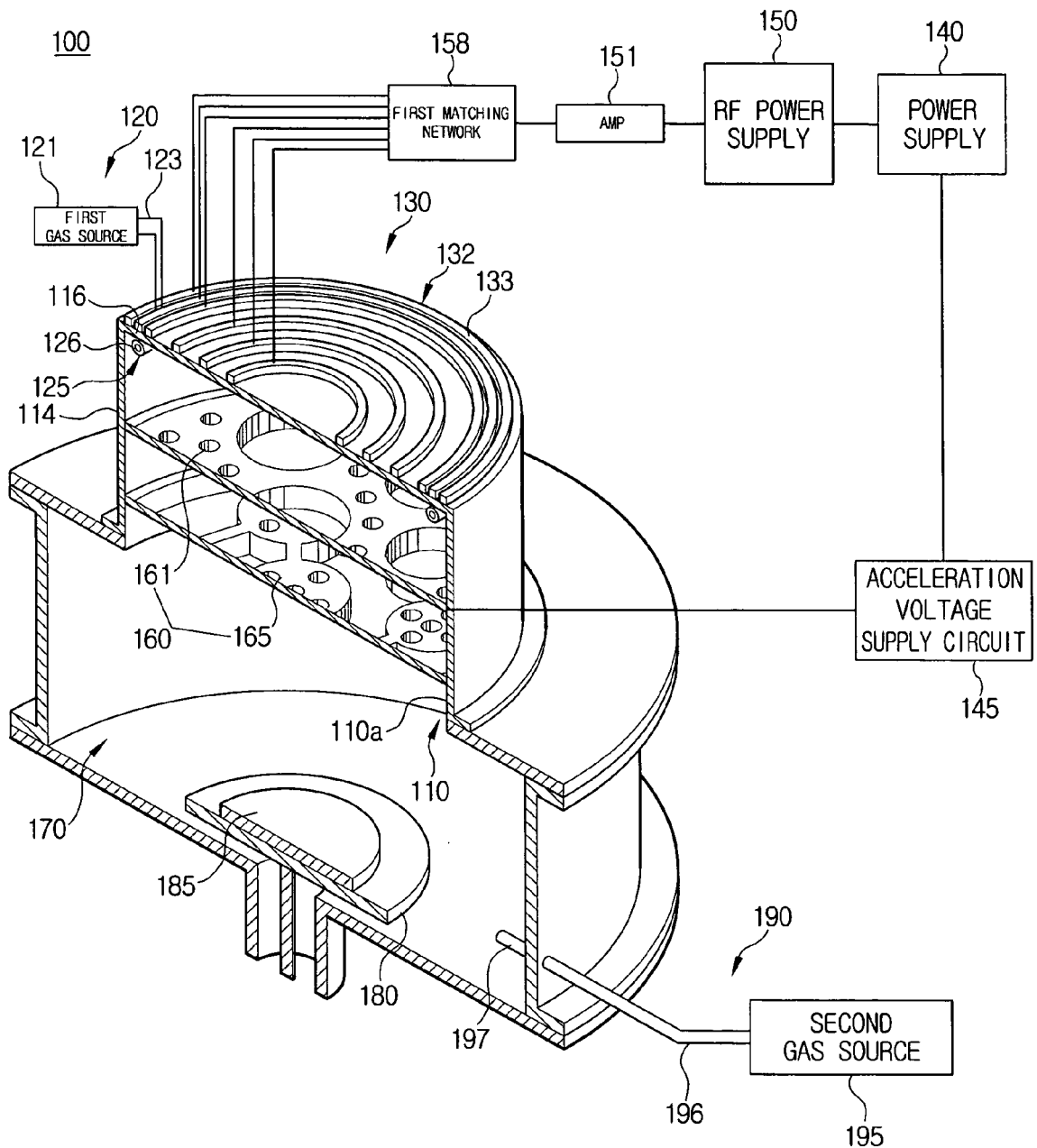
FIG. 5 is a schematic cut-away perspective view showing a plasma processing system including a plasma accelerating apparatus according to an exemplary embodiment of the present invention.

FIG. 5 is a schematic cut-away perspective view showing a plasma processing system 100 including a plasma accelerating apparatus according to an exemplary embodiment of the present invention.

The plasma processing system 100 is a plasma etcher that forms a selective etching pattern on a substrate 185 by evaporating or ashing a thin film such as photoresist coated on the substrate using high temperature ionized plasma to remove the thin film from the substrate.

Referring to FIG. 5, the plasma processing system 100 includes a plasma channel 110, a first gas supply portion 120, a plasma generator 130, a plasma accelerating portion 160, a process chamber 170, and a second gas supply portion 190. The plasma channel 110, the first gas supply portion 120, the plasma generator 130, and the plasma accelerating portion 160 constitute a plasma accelerating apparatus according to an exemplary embodiment of the present invention.

Gas is ionized and accelerated through the plasma channel 110. The plasma channel 110 is cylindrical in shape. The plasma channel 110 includes an outlet port 110a, which is open in a gas discharge direction. The plasma channel 110 is composed of a cylindrical member 114. The outlet port 110a is formed at a lower end of the cylindrical member 114. The cylindrical member 114 is made of $SiO_2$ such as quartz, for example, or non-conductive materials such as Pyrex. The outlet port 110a communicates with the process chamber 170.

The first gas supply portion 120 includes a first gas injection portion 125 and a first gas source 121. The first gas injection portion 125 is installed at an end wall 116 of the plasma channel 110 so as to be fixed thereto. The first gas injection portion 125 includes a gas injection ring 126 connected to the first gas source 121 through a first connection pipe 123. The gas injection ring 126 includes a plurality of discharge holes formed in the outlet port 110a side. The diameter of each of the discharge holes is smaller than that of the gas injection ring 126. The first gas source 121 stores ionization gases of group 0 such as Ar, reaction gases such as $O_2$ or $O_2$ compounds, and process gases such as $C_2F_2$.

The plasma generator 130 is arranged at an outer peripheral part (top part of FIG. 5) of an end wall 116 of the plasma channel 110. The plasma generator 130 includes an upper circle loop inductor 132. The upper circle loop inductor 132 is provided with an upper circle loop coil 133. The upper circle loop coil 133 is wound around an outside of the end wall 116 of the plasma channel 110 by a plurality of turns. An RF power supply 150 applies RF energy of approximately 500 W to 5.0 kW to the upper circle loop coil 133 through a first amplifier 151 and a first matching network 158, which is connected to the first amplifier 151, so as to operate the upper circle loop coil 133 at a frequency of approximately 2 MHz. In other words, the upper circle loop coil 133 applies RF energy to the gas fed through discharge holes of the gas injection ring 126, causing electrons generated by the RF energy to collide with neutral atoms of gas. Accordingly, the gas is ionized so as to generate a plasma beam.

Furthermore, an electric current of 40 A is supplied to the upper circle loop coil 133 through the first amplifier 151 and the first matching network 158, wherein the first amplifier 151 is connected to an RF power supply 150. The upper circle loop coil 133 induces a magnetic field and a secondary electric current in the plasma channel 110 to generate an electromagnetic force, which accelerates the plasma beam toward the outlet port 110*a* of the plasma channel 110.

The plasma accelerating portion 160 is arranged at an internal space of the plasma channel 110. The plasma accelerating portion 160 includes first grid 161 and a second grid 165, which are transversely arranged and spaced apart from each other by a predetermined distance in the plasma channel 110. The first grid 161 and the second grid 165 accelerate the plasma beam generated by the plasma generator 130 to the outlet port 110*a* of the plasma channel 110 by an electric field.

The first grid 161 and the second grid 165 are separated by a predetermined distance from each other within a range that electrons and positive ions included in the plasma beam are movable by positive and negative pulse voltages which are applied to the first grid 161 and the second grid 165 by an acceleration voltage supply circuit 145. The predetermined distance is set to a distance in which electrons and positive ions included in the plasma beam are moved by the positive and negative pulse voltages so as to be easily and efficiently mixed and neutralized. For example, the predetermined distance may be approximately 10 cm to 70 cm, and may be preferably, but not necessarily, 50 cm.

Figure 7A:
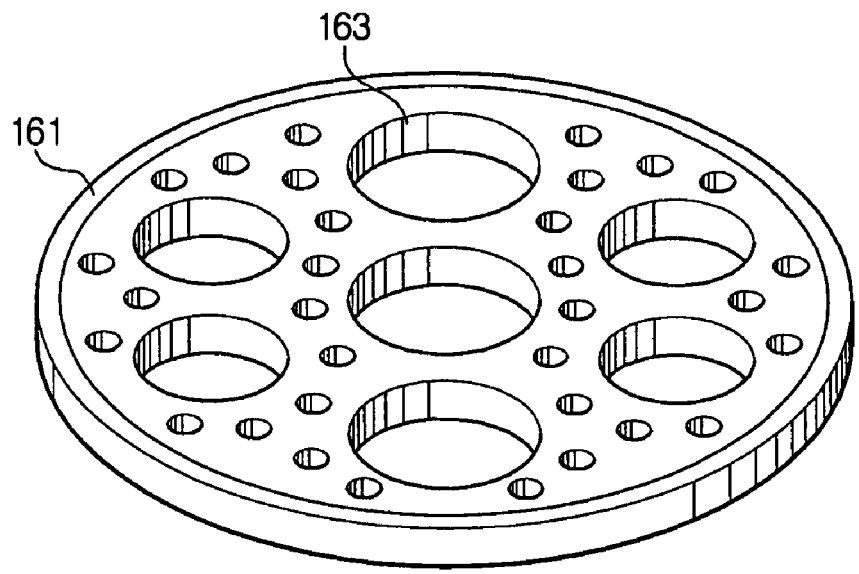
FIGS. 7A and 7B are perspective views showing first and second grids of a plasma accelerating portion of the exemplary plasma processing system shown in FIG. 5.

As shown in FIG. 7A, the first grid 161 is composed of a circular plate of a conductive metal including a first opening 163 through which a plasma beam passes. As an acceleration voltage supply circuit 145 for controlling a power supply from a power supply 140 applies a positive pulse voltage to the first grid 161, the first grid 161 further accelerates electrons included in the plasma beam generated and accelerated by the plasma generator 130.

Figure 8A:
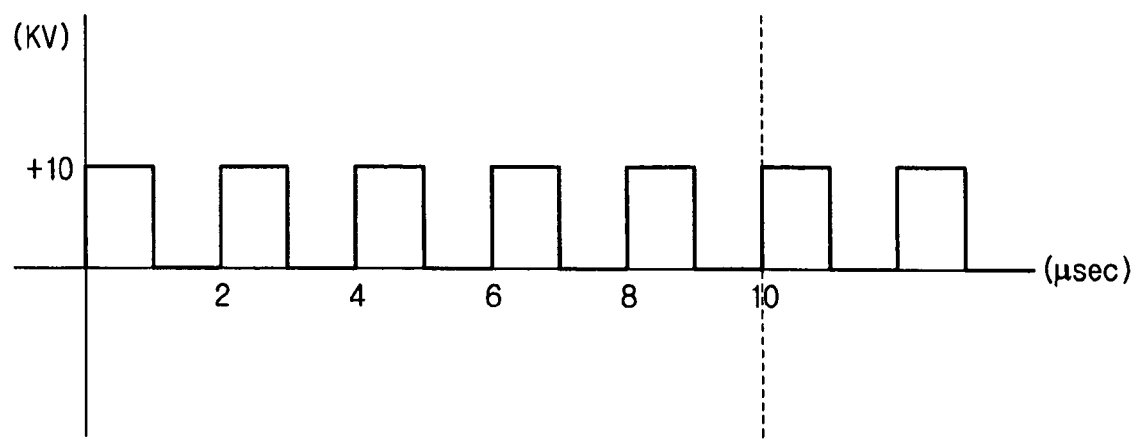
FIGS. 8A and 8B are waveform diagrams showing a pulse voltage that is applied to first and second grids of a plasma accelerating portion of the exemplary plasma processing system shown in FIG. 5.

As shown in FIG. 8A, the positive pulse voltage applied to the first grid 161 is a voltage of five pulses of +10 kV, wherein the five pulses repeat on/off in 1 μsec intervals during a time period of 10 μsec.

The first opening 163 is configured by a plurality of circle holes arranged in a predetermined pattern so that electrons drawn by an electric field generated due to the positive voltages applied to the first grid 161 and positive ions drawn by an electric field generated due to the negative voltage applied to the second grid 165 (to be described later) may pass through the first opening 163. Although the first opening 163 is configured by a circle hole in an exemplary embodiment of the present invention, other constructions capable of passing electrons and ions may be applicable thereto.

Figure 7B:
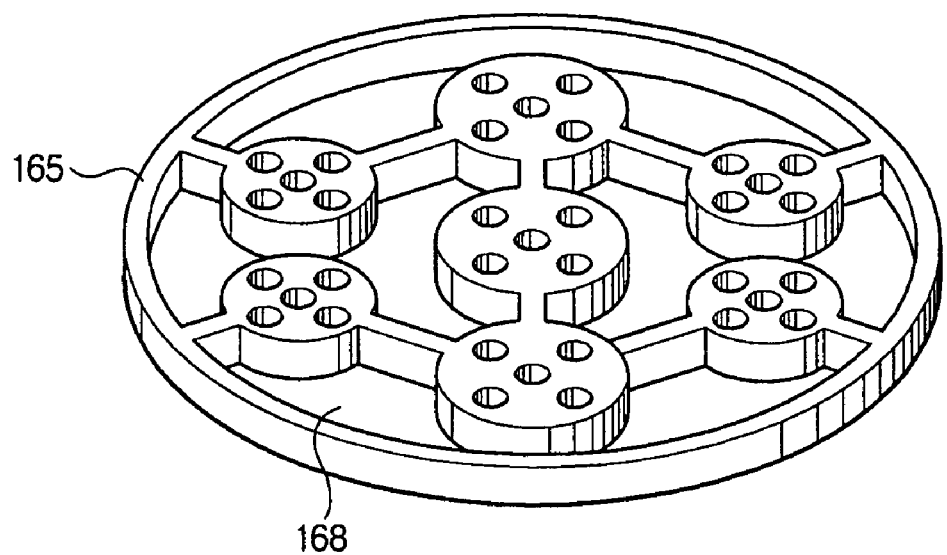

As shown in FIG. 7B, the second grid 165 is composed of a circular plate of a conductive metal including a second opening 168 through which a plasma beam passes. As an acceleration voltage supply circuit 145 applies a negative pulse voltage to the second grid 165, the second grid 165 accelerates positive ions of a plasma beam generated by the plasma generator 130.

Figure 8B:
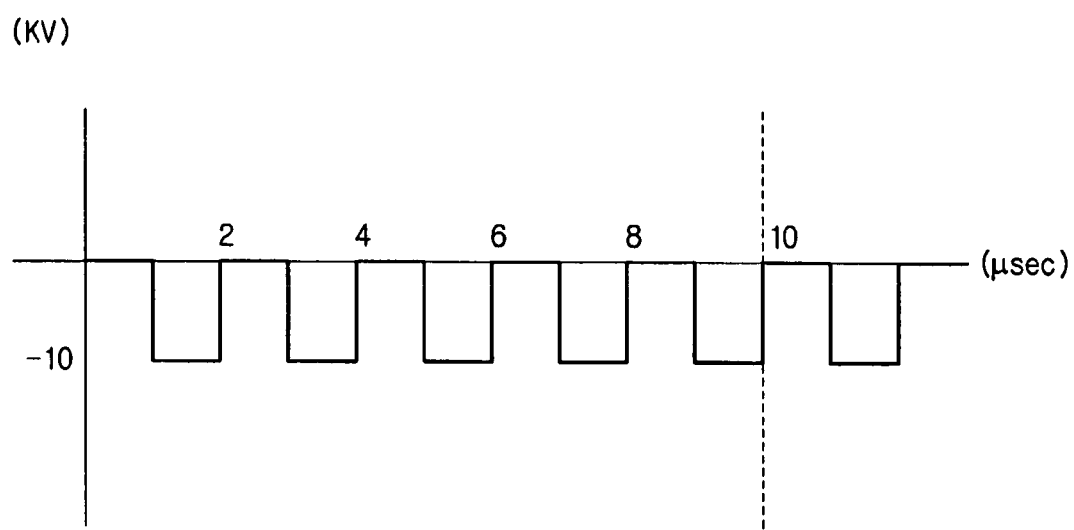

As shown in FIG. 8B, the negative pulse voltage applied to the second grid 165 is a voltage of five pulses of −10 kV, wherein the five pulses repeat on/off in 1 μsec intervals during a time period of 10 μsec.

The acceleration voltage supply circuit 145 applies the negative pulse voltage to be delayed from a pulse of the positive pulse voltage applied to the first grid 161 for 1 μsec so that pulses of positive and negative voltages are not simultaneously applied to the first and second grids 161 and 165, respectively. The reason for this is that if the positive and negative voltages are simultaneously applied to the first and second grids 161 and 165, respectively, electrons and ions are not moved to the first and second grids 161 and 165 since the first grid 161 draws electrons but pushes ions by an electric field of the positive pulse voltage, whereas the second grid 165 pushes electrons but draws ions by an electric field of the negative pulse voltage.

The second opening 168 has a shape opposite to a circular hole shape of the first opening 163 so as not to communicate with the first opening 163 in a beam direction so that the plasma beam passed through the first opening 163 is not straightly moved through the second opening 168.

Figure 6:
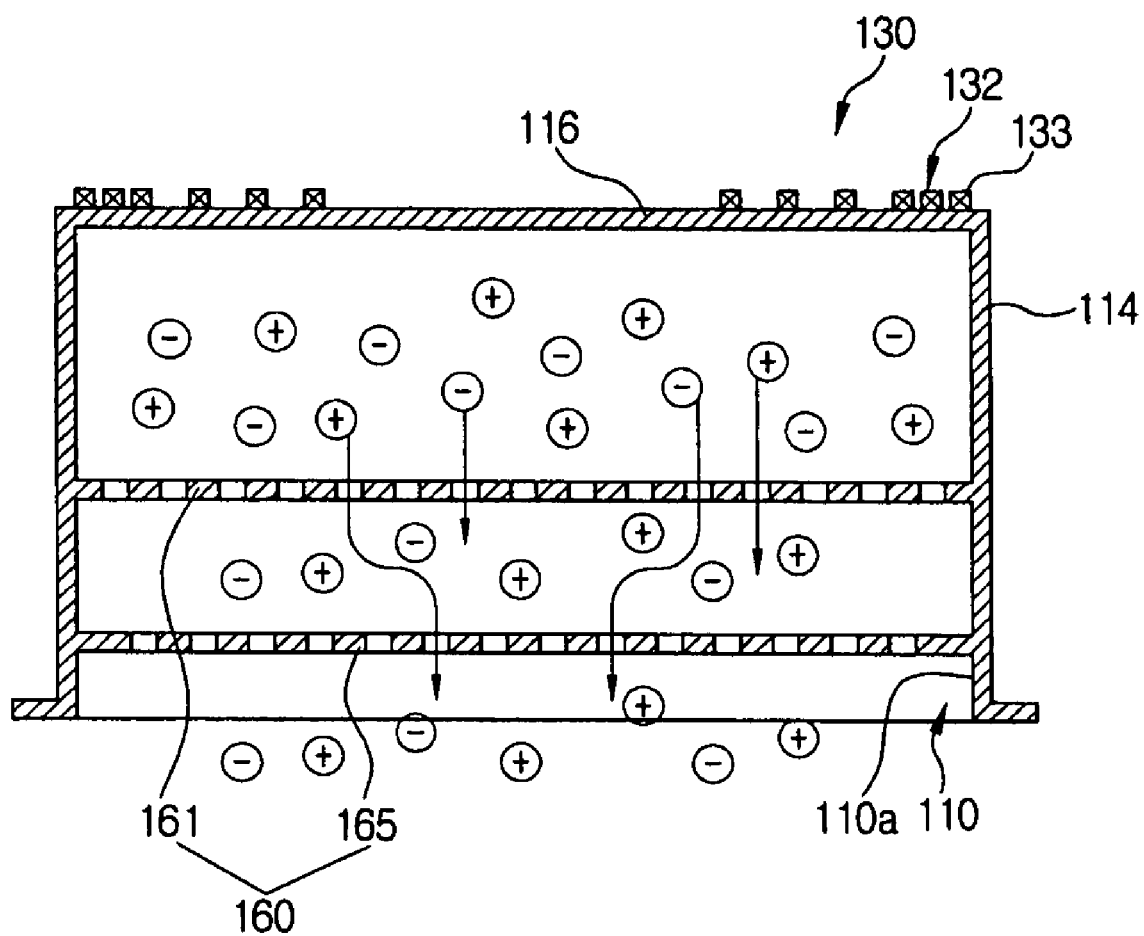
FIG. 6 is a cross-sectional view showing a plasma channel of the exemplary plasma processing system shown in FIG. 5.

Accordingly, as shown in FIG. 6, when a pulse of a positive pulse voltage applied to the first grid 161 from the acceleration voltage supply circuit 145 is activated, due to a drawing acceleration by an electric field of a positive pulse voltage applied to the first grid 161, a first part of the electrons included in the plasma beam which is generated and accelerated by the plasma generator 130, is moved in the direction of the second grid 165 through the first opening 163 of the first grid 161. Further, a second part of the electrons included in the plasma beam is moved into an outlet port 110*a* through the first opening 163 and the second opening 168 of the first grid 161 and the second grid 165, respectively. A third part of the electrons is drawn to the vicinity of the first opening 163 of the first grid 161 by an electric field of the positive pulse voltage applied to the first grid 161.

Next, when a pulse of the positive pulse voltage applied to the first grid 161 is inactivated, whereas a pulse of the negative pulse voltage applied to the second grid 165 is activated, due to a drawing acceleration by an electric field of the negative pulse voltage, a first part of the positive ions is moved into the second grid 165 through the first opening 163 of the first grid 161, a second part of the positive ions is moved into the outlet port 110*a* through the first opening 163 and the second openings 168 of the first grid 161 and the second grids 165, respectively. A third part of the positive ions is drawn to the vicinity of the second opening 165 of the second grid 165 by an electric field of the negative voltage applied to the second grid 165.

At this time, positive ions moved into the second grid 165 mix with electrons moved into the second grid 165 by the electric field of the positive pulse voltage, whereas positive ions moved into the outlet port 110*a* mix with electrons moved into the outlet port 110*a* through the first opening 163 and the second opening 168. Further, the electrons drawn to the vicinity of the first opening 163 of the first grid 161 are pushed by the electric field of the negative pulse voltage of the second grid 165 and moved into the end wall 116, and the electrons moved into the outlet port 110*a* are pushed by the electric field of the negative pulse voltage of the second grid 165 and continue to be moved into the outlet port 110*a*.

Then, when the pulse of the negative pulse voltage applied to the second grid 165 is inactivated, and the positive pulse voltage is applied to the first grid 161, by the electric field of the positive voltage of the first grid 161, a first part of the electrons generated and accelerated by the plasma generator and electrons pushed and moved into the end wall 116 by the electric field of the negative pulse voltage at the time when the negative voltage was applied to the second grid 165, are moved into the second grid 165 through the first opening 163. A second part of the electrons are moved into the outlet port 110*a* through the first opening 163 and the second opening 168, and a third part of the electrons are drawn to the vicinity of the first opening 163 of the first grid 161 by the electric filed of the positive pulse voltage applied to the first grid 161.

At this time, the electrons moved into the second grid 165 mix with the positive ions moved into the second grid 165 by the electric field of the negative pulse voltage. Further, the electrons moved into the outlet port 110a mix with the positive ions moved into the outlet port 10a through the first opening 163 and the second opening 168. In addition, the positive ions drawn to the vicinity of the second opening 168 of the second grid 165 and the positive ions moved into the outlet port 110a are pushed by the electric field of the positive pulse voltage of the first grid 161 and continue to be moved into the outlet port 110a.

The aforementioned operation repeats by alternately activating and inactivating pulses of the positive and negative pulse voltages applied to the first grid 161 and to the second grid 165, respectively, from the acceleration voltage supply circuit 145. As a result, the electrons and positive ions which are in the plasma beam accelerated by the first grid 161 and the second grid 165 mix with each other to produce neutral particles having, for example plasma density of $10^{11}$ to $10^{12}$ electrons/cm$^3$ and ion energy of 20 eV to 500 eV.

The process chamber 170 communicates with the outlet port 110a of the plasma channel 110. The plasma beam moved by an electric field of the plasma accelerating portion 160 is supplied into the process chamber 170. The process chamber 170 maintains a pressure of approximately 0.3 mTorr to 3 mTorr. A substrate holder 180 is disposed at an internal center of the process chamber 170. A substrate 185 on which a thin film, such as photoresist, to be etched is coated is fixed to the substrate holder 180. The substrate holder 180 is made of a copper block, for instance, which is heated or cooled by a heating/cooling circuit (not shown). A second gas injection portion 197 of the second gas supply portion 190 is disposed at one side of the process chamber 170, and supplies a process gas into the process chamber 170. The second injection portion 197 is connected to a second gas source 195 through a connection pipe 196. The second gas source 195 stores a process gas such as $C_2F_2$, for example.

As noted previously, although the plasma processing system 100 with a plasma accelerating apparatus according to an exemplary embodiment of the present invention has been described such that the first grid 161 and the second grid 165 constitute the plasma accelerating portion 160, the present invention is not limited thereto. For instance, in order to further increase a moving speed of the plasma beam, besides the first grid 161 and the second grid 165 installed at the plasma channel 110, a plasma processing system consistent with an exemplary embodiment of the present invention may further include an additional grid (not shown) installed at a suitable position of the plasma channel 110 or the process chamber 170.

Figure 9:
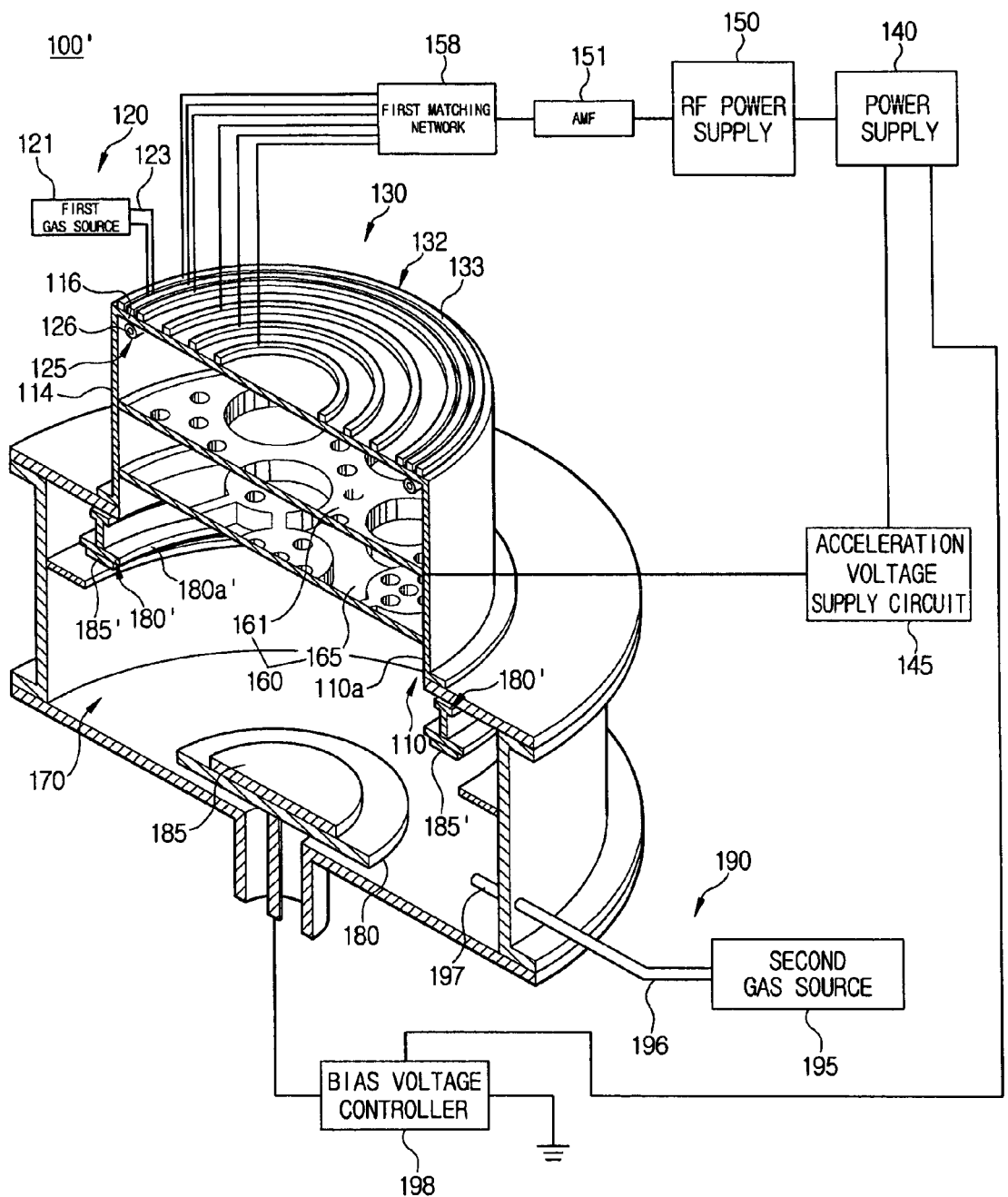
FIG. 9 is a schematic cut-away perspective view showing a plasma sputtering system including a plasma accelerating apparatus according to an exemplary embodiment of the present invention.

Furthermore, although an exemplary embodiment of the present invention has been described in which the plasma processing system 100 with a plasma accelerating apparatus is a plasma etcher, which forms a selective etching pattern on a substrate 185 using plasma of a high temperature, the present invention is not restricted thereto. For example, an exemplary embodiment of the plasma processing system of the present invention can be configured by a plasma sputtering system 100' as shown in FIG. 9, which deposits a thin film on a substrate using similar constructions and operational functions to those of the plasma processing system 100 described above. In this case, as shown in FIG. 9, the plasma sputtering system 100' further includes a sputter target 186. A predetermined bias voltage generated by a bias voltage controller 198 is applied to the sputter target 186. A substrate 185' is fixed to a substrate holder 180' above the sputter target 186. The substrate holder 180' is rotated based a fixed axis (not shown) to uniformly deposit materials sputtered from the sputter target 186 on the substrate 185'. Also, the substrate holder 180' includes a circular opening 180a' through which the plasma beam accelerated in the plasma accelerating portion 160 passes so that the plasma is guided to the sputter target 186. A horizontal baffle 193 is disposed at an upper portion of the second gas injection portion 197 and controls gas pressure in the vicinity of the substrate 180'.

An operation of the plasma processing plasma system 100 having the aforementioned construction will be now explained by reference to FIGS. 5 and 6. Firstly, a gas such as $C_2F_2$, $O_2$, or Ar, for example, from the first gas source 121 is supplied into the plasma channel 110 through the first gas injection portion 125. Neutral atoms of the gas that are supplied into the plasma channel 110 collide with electrons generated by an RF energy applied by an upper circle loop inductor 132, with the result that the gas is ionized so as to produce plasma beam. At this time, the upper circle loop inductor 132 is operated at an RF energy of 1.8 kW at a frequency of approximately 2 MHz, for example. The plasma beam is accelerated from an inside of the plasma channel 110 to an outlet port 110a of the plasma channel 110 by an electric field produced according to activation/inactivation of pulses of the positive and negative pulse voltages applied to the first grid 161 and the second grid 165 from the acceleration voltage circuit 145. Moreover, the plasma beam is discharged to an inside of the process chamber 170 through the outlet port 110a with a plasma density of approximately $10^{11}$ electrons/cm$^3$ to $10^{12}$ electrons/cm$^3$, for example, and ion energy of approximately 20 eV to 500 eV.

At this time, the plasma beam discharged to the inside of the process chamber 170 through the outlet port 110a is directed to a substrate 185, which is fixed to the substrate holder 180 of the process chamber 170. Further, the process gas from the second gas source 195 is supplied into the process chamber 170 through the second gas injection portion 197 with a pressure of approximately 1 mTorr. Accordingly, the plasma beam collides with the process gas and becomes directional or non-directional etching ions or atoms. Consequently, a thin film, such as photoresist, of the substrate 185 which is disposed under a center of the plasma channel 110 inside the process chamber 170, is vaporized or carbonized so as to be etched.

As apparent from the above description, the plasma accelerating apparatus and a plasma processing system according to an exemplary embodiment of the present invention accelerates positive ions and electrons of a plasma beam by an electric field by using a plasma accelerating portion having first and second grids, thereby elevating a drift velocity of the plasma beam more efficiently as compared with a conventional accelerating apparatus using an electromagnetic force induced by a magnetic field and a secondary current. Furthermore, the plasma accelerating apparatus and a plasma etcher or a plasma sputtering system with the plasma accelerating apparatus consistent with an exemplary embodiment of the present invention can be simply manufactured and configured.

The foregoing embodiments and advantages are merely exemplary and are not to be construed as limiting the present invention. The present teachings can be readily applied to other types of apparatuses. Also, it is contemplated that many alternatives, modifications, and variations to the exemplary embodiments described above will be apparent to those skilled in the art without departing from the spirit and scope of the embodiments of the present invention as defined in the following claims.

What is claimed is:

1. A plasma accelerating apparatus, comprising:
a channel comprising an outlet port opening at an end of the channel, wherein a plasma beam passes through the channel; and
a plurality of grids;
wherein the plurality of grids are transversely arranged;
wherein the plurality of grids are spaced apart from each other by a predetermined distance;
wherein the plurality of grids are provided in the channel;
wherein the plurality of grids accelerate the plasma beam toward the outlet port of the channel with an electric field;
wherein the plurality of grids comprises:
a first grid comprising at least a first opening through which the plasma beam passes, and a second grid comprising at least a second opening through which the plasma beam passes;
wherein the first opening and the second opening are formed opposite to each other so that at least a first portion of the first opening and a second portion of the second opening do not communicate with each other with respect to a moving direction of the plasma beam.

2. The plasma accelerating apparatus as claimed in claim 1, wherein a positive pulse voltage is applied to the first grid so that the first grid accelerates electrons of the plasma beam; and
wherein a negative pulse voltage is applied to the second grid so that the second grid accelerates ions of the plasma beam.

3. The plasma accelerating apparatus as claimed in claim 2, wherein the positive pulse voltage and the negative pulse voltage are not simultaneously applied so that the positive pulse voltage accelerates electrons toward the grids and pushes ions away from the grids and so that the negative pulse voltage pushes electrons away from the grids and accelerates ions toward the grids.

4. A plasma processing system, comprising:
a channel comprising an outlet port opening at an end of the channel, wherein a plasma beam passes through the channel;
a plasma accelerating portion comprising a plurality of grids;
wherein the plurality of grids are transversely arranged;
wherein the plurality of grids are spaced apart from each other by a predetermined distance;
wherein the plurality of grids are provided in the channel;
wherein the plurality of grids accelerate the plasma beam toward the outlet port of the channel with an electric field; and
a process chamber communicating with the outlet port of the channel, wherein the process chamber comprises a substrate holder for fixing a substrate;
wherein the plurality of grids comprises:
a first grid comprising at least a first opening through which the plasma beam passes, and a second grid comprising at least a second opening through which the plasma beam passes;
wherein the first opening and the second opening are formed opposite to each other so that at least a first portion of the first opening and a second portion of the second opening do not communicate with each other with respect to a moving direction of the plasma beam.

5. The plasma processing system as claimed in claim 4, wherein a positive pulse voltage is applied to the first grid so that the first grid accelerates electrons of the plasma beam; and
wherein a negative pulse voltage is applied to the second grid so that the second grid accelerates ions of the plasma beam.

6. The system as claimed in claim 5, wherein the positive pulse voltage and the negative pulse voltage are not simultaneously applied so that the positive pulse voltage accelerates electrons toward the grids and pushes ions away from the grids and so that the negative pulse voltage pushes electrons away from the grids and accelerates ions toward the grids.

7. The plasma accelerating apparatus as claimed in claim 1, wherein the first grid and the second grid are spaced apart from each other by the predetermined distance of 10 cm to 70 cm.

8. The plasma accelerating apparatus as claimed in claim 4, wherein the first grid and the second grid are spaced apart from each other by the predetermined distance of 10 cm to 70 cm.

* * * * *